United States Patent [19]

Poisel

[11] Patent Number: 5,489,855
[45] Date of Patent: Feb. 6, 1996

[54] APPARATUS AND PROCESS PROVIDING CONTROLLED PROBING

[76] Inventor: C. Edward Poisel, 7034 Burnham Cir., Indianapolis, Ind. 46256

[21] Appl. No.: 105,636

[22] Filed: Aug. 13, 1993

Related U.S. Application Data

[63] Continuation-in-part of Ser. No. 570,802, Aug. 22, 1990, abandoned.

[51] Int. Cl.$^6$ ................................................. G01R 1/067
[52] U.S. Cl. ............................................. 324/762; 324/72.5
[58] Field of Search ........................... 324/158 P, 158 F, 324/72.5, 762, 758, 757

[56] References Cited

U.S. PATENT DOCUMENTS 4,123,706  10/1978  Roch .................................. 324/158 P

*Primary Examiner*—Ernest F. Karlsen
*Attorney, Agent, or Firm*—Robert A. Spray

[57] ABSTRACT

A probe apparatus especially useful in probing circuit boards used in electronic equipment. Two beam support members of unequal length and in a spaced relationship to a work object having the longer beam between the shorter beam and the work-object, the two beams being attached to a moveable support at joints substantially displaced in the direction of the beams' lengths, the other end of the two beams being attached to the probe support members at joints that follow the arcs of rotation required to cause the probe tip to pass through three points of a straight line travel of the probe tip during z-axis flexing, thus maintaining the position of the probe tip in the x-y plane during z-axis flexing. The resulting motion is a rotation of the end opposite the probe tip, in the x-z plane, pivoting at the initial contact point of the probe tip, thus avoiding an x-y plane "wiping" of the probe over the contact area which may damage the work object being probed.

16 Claims, 4 Drawing Sheets

5,489,855

APPARATUS AND PROCESS PROVIDING CONTROLLED PROBING

PRIOR APPLICATION

This application is a Continuation-in-Part of the present inventor's prior U.S. application Ser. No. 07/570,808, filed Aug. 22, 1990 now abandoned. The disclosures of the prior application are herein incorporated by reference.

FIELD OF THE INVENTION

This invention relates generally to the controlled placement of a probe, such as pin, needle, blade, wire or similar object having a shaped contact portion, which makes an operational or sensing contact with a contact area, e.g., a terminal or conductor of an electronic circuit for the purpose of testing or monitoring the circuit or circuit element.

More particularly, the invention relates to apparatus and a process for achieving a sensing or series of sensing procedures or otherwise operatively touching a contact area of a work object, without causing excessive mechanical damage to the circuit.

BACKGROUND OF THE INVENTION

In numerous applications in the electrical art, the electrical circuits needed have been fabricated using various methods that have become known as microcircuits. Although some of these circuits can be very large in size, the internal conductors and components generally are very small and fragile; and thus their manufacturing process must be continually monitored and controlled to prevent defective circuits.

One common monitoring method is to test the product during and after manufacturing. The usual method of testing such a product is to mechanically probe the internal circuitry, using various shaped metallic probes. Although fixed position probes have been used, the increasing density and the larger number of different circuit codes which a manufacturer must produce has required manufacturers to use movable probes, positioned by computer controlled robotic means.

In either case, unless great care is taken, the act of mechanically probing the circuit often damages the circuit under test. The damage during such probing occurs because of one or more factors, e.g., the shape of the probe, impact force of the probe when contacting the circuit, the subsequent static force applied to the circuit, and mechanical lateral motion of the probe in contact with the circuit under test.

Also, because of the need to test large numbers of circuits as fast as possible, the speed required to lower and raise the probe to and from the circuit, and the resulting momentum imparted to the probing assembly often creates high impact forces, over-travel, and a damaging lateral movement of the probe on the circuit.

Probes that make contact to the circuit at an angle that is not perpendicular to the surface of the circuit cause damage, resulting from the normal rubbing or wiping action caused by the bending of the extended flexible section of the probe body during probe flexing.

As a result, the probing of the circuits as a method of reducing manufacturing defects or the testing of completed circuits can actually cause defects.

SUMMARY OF THE INVENTION

Such undesirable limitation on the probing of circuits, due to damage caused by probing procedures, normally but not necessarily a microcircuit as a work-object, is overcome according to the present invention, considered both a method and an apparatus.

In considering the present invention, it may be helpful to consider a conventional probing apparatus for testing of electrical circuitry. Conventionally, the apparatus is comprised of probes, of which many different types of probes may be used. Some means is provided for positioning one or more probes in the x-y axis over each location to be probed; and an additional conventional means such as an air, vacuum, hydraulic or electrical solenoid, a step or servo motor, or cam operated device, is provided for lowering the probes in the z-axis into contact with the surface of the circuit. The probe tips undergoes a substantial upward movement, relative to its support means, caused by contact with the surface of the circuit.

That conventional structure of a probing apparatus is improved according to the invention by (a) mounting one or more probes to the linear z-axis slide mechanism using two cantilever flexible beams of unequal length in one embodiment, and mounting the beams spaced one above the other; and (b) attaching both beams at their inner ends to the z-axis support at points preferably displaced from each other in the x-axis direction of the beams' lengths, and attaching their outer ends of the beams to a second support, the second support means carrying a downwardly positioned probe body with a probe tip for contacting the surface to be probed.

The relative length of the beams and the relative positions of the inner ends of the beams determine the arcuate path of the outer ends of the beams. When the outer end of the lower beam is attached to the probe body, even if the upper beam is not connected at the inner end, the point of connection of the outer end of the upper beam to the probe body will move in an arcuate path as the downward directed probe tip moves in a substantially linear z-axis direction. By making the length of the upper beam and the position of the inner end of the upper beam to be equal to the radius and center point of this arcuate path, the outer end of the upper beam will follow this arcuate path; thus this length and position of the inner end will cause the probe tip to follow substantially the same linear z-axis path.

The radius and center point of the arcuate path of the outer end of the upper beam is determined by calculating the radius and center point of a circle passing through three points spaced throughout the length of the arcuate path created when the probe tip follows a linear z-axis path.

The concepts of the invention, and its operativity, are not limited to any certain relative proportions of size, or type of beam structure, i.e., flexible along its entirety or substantially hinged at ends, and thus words such as "flexible", "significantly" and "substantially" are used herein in an operational sense.

The conventional structure of a probing apparatus is improved according to the invention when the relative positions of the inner ends of the beams are displaced from each other in the x-axis direction by at least one tenth of the length of the lower beam for probes whose downward extended probe tip z-axis length is less than approximately eight times the separation distance between the upper and lower beam, and continues to improve as the length of the upper beam and position of the inner end of the upper beam approaches the radius and center point of the arcuate path needed to maintain the probe tip in a substantially linear path as discussed herein.

By the incorporation of such concepts as additions to the conventional prober apparatus, the invention provides gentle nondestructive probing with non-wiping probe contact.

The invention thus advantageously provides novel apparatus, and a novel method or process for making the apparatus, which eliminates substantially all the destructive wiping action caused by the flexing of the probe support beam, by using the interaction caused by the length and support positions of two flex beams to maintain position of the probe tip. When the probe comes in contact with the circuit, the resulting motion is a rotation or pivoting of the upper section of the probe body in the x-z plane, pivoting at the initial contact point of the probe tip. Variation in the surface elevation being probed, such as with warped circuit boards, will cause the beams to flex without significantly affecting probe position.

BRIEF DESCRIPTION OF DRAWINGS

For a better understanding of the invention, reference is made to the following description of illustrative embodiments thereof, and to the accompanying somewhat schematic or diagrammatic drawings which form part of this specification, wherein.

DETAILED DESCRIPTION OF THE INVENTION

Figure 1:
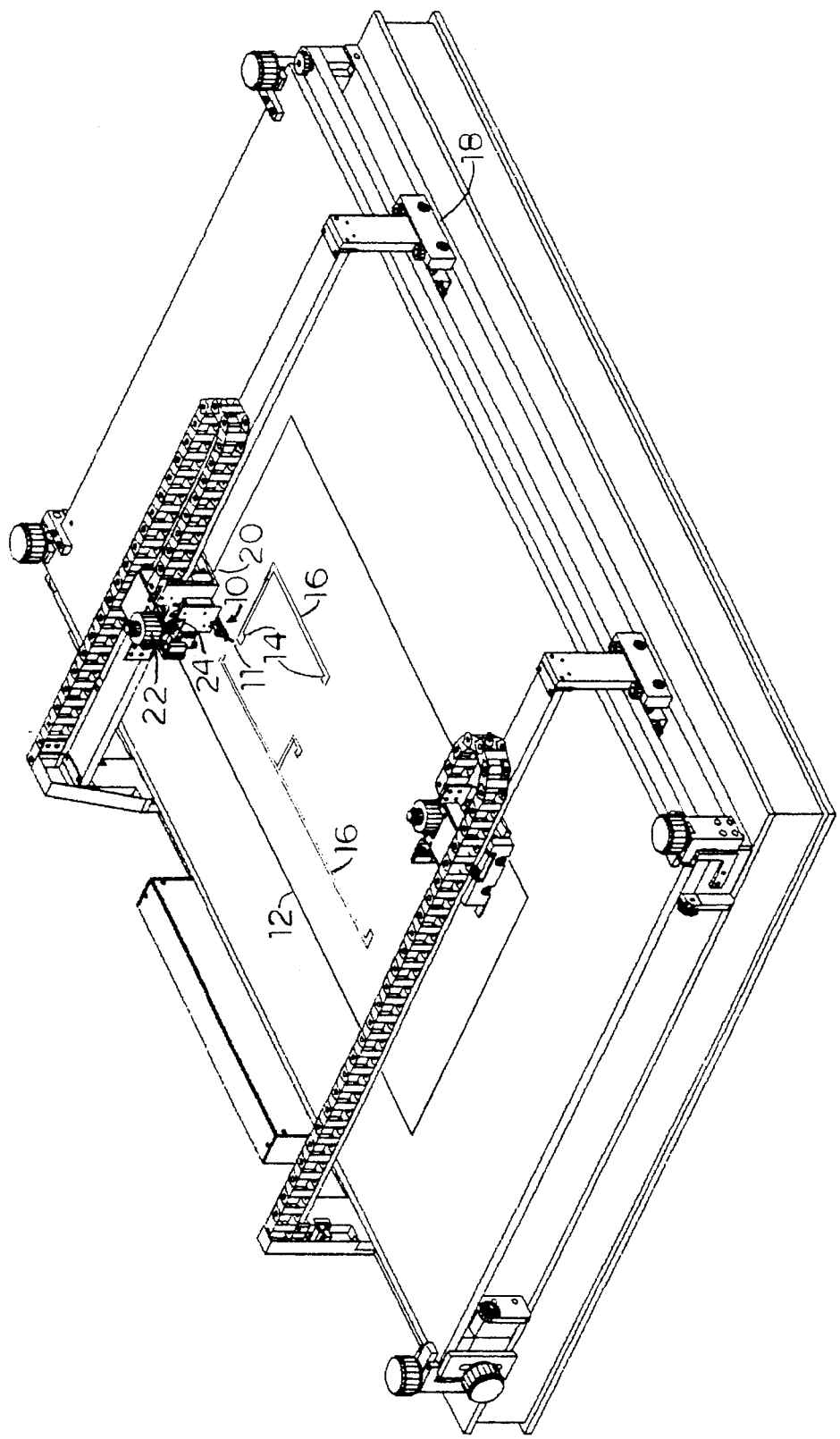
FIG. 1 is an isometric view of a pair of the illustrative probing apparatus devices according to the invention, in an illustrative use, in an overall apparatus in which the probes are used, monitoring some circuit parameter of a circuit board.

In the embodiment of the invention and its concepts as are illustrated in the drawings, the components are here listed in summary form:

| | |
|---|---|
| 10 | probe assembly |
| 11 | needle type probe |
| 12 | circuit board work object |
| 14 | contact area of 12 |
| 16 | conductors of 12 |
| 18 | x-axis mover |
| 20 | y-axis mover |
| 22 | step motor |
| 24 | solenoid |
| 26 | z-axis slide mechanism |
| 28 | mounting plate |
| 30 | upper beam |
| 32 | lower beam |
| 33 | inner bolt for the beams |
| 34 | inner end of beam 30 |
| 36 | inner end of beam 32 |
| 38 | mounting bracket assembly |
| 39 | outer bolt for the beams |
| 40 | outer end of beam 30 |
| 42 | outer end of beam 32 |

-continued

Figure 4:
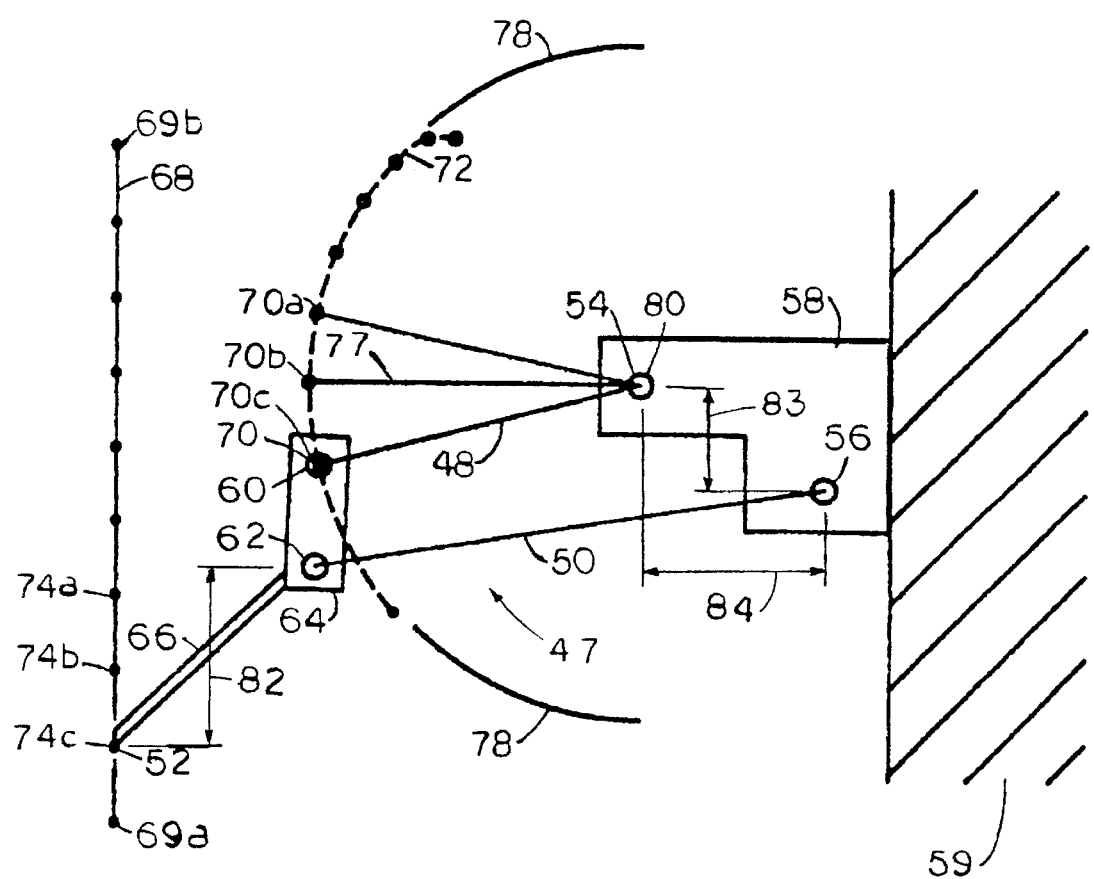
FIG. 4 is a side elevation schematic view of a second embodiment, depicting the principle of operation and the basic features of a probe assembly to illustrate operativity of both embodiments.

| | |
|---|---|
| 44 | front spacer block |
| 46 | nose plate |
| 47 | the probe assembly of FIG. 4 |
| 48 | beam of FIG. 4 (upper) |
| 50 | beam of FIG. 4 (lower) |
| 52 | probe tip of FIG. 4 |
| 54 | end of 42 remote from 52 |
| 56 | end of 50 remote from 52 |
| 58 | mounting bracket |
| 59 | support or carrying means |
| 60 | end of 48 adjacent 52 |
| 62 | end of 50 adjacent 52 |
| 64 | nose piece in FIG. 4 |
| 66 | probe tip body in FIG. 4 |
| 68e | vertical line as z-axis in FIG. 4 |
| 69a | highest point of contact on line 68 |
| 69b | lowest point of contact on line 68 |
| 70 | pivot point or pivot joint |
| 70a | higher point on 72 |
| 70b | intermediate point on 72 |
| 70c | lower point on 72 |
| 72 | curved dash line path in FIG. 4 |
| 74a | higher point of 68 |
| 74b | intermediate point of 68 |
| 74c | lower point an 68 |
| 77 | radius |
| 78 | arc defined by 70a, 70b, 70c in FIG. 4 |
| 80 | fixed end pivot joint of 48 |
| 82 | downward component length of probe 66 |
| 83 | vertical separation of joints 54 and 56 |
| 84 | lateral displacement of beams' first joints 54/56 |

Apparatus according to the invention is shown pictorially in an illustrative use in FIG. 1. As there shown, a pair of probe assemblies 10 are positioned above a circuit board 12 work object, particularly over a contact area 14 of the circuit board 12 to be tested. The contact area 14 is connected through conductors 16 to other components, and to other contact areas 14.

The specific microcircuit technology is shown schematically here as background, to illustrate the general usage and to indicate structure of conventional probing apparatus; and use of this invention with work objects having any surface requiring probing, not necessarily only microcircuits, could benefit from this invention. And also, as within the scope of this invention, is its use with any technology requiring the accurate positioning of a probe to a fragile surface contact area of a unit with a mechanically and potentially destructive probe.

The apparatus of the invention described herein includes at least one probe assembly 10, with a needle type probe 11, although other types of probes 11 may be used. A positioning means 18 and 20 positions one or more probes in the x-axis and the y-axis respectively, so that the probe tip of probe assembly 10 will be properly set over each location 14 to be probed.

For use in the method and apparatus of the illustrative embodiment, different position and speed control means 22 and 24 are provided for lowering the probe assemblies 10 and their probes 11 in the z-axis, and for contact with the contact area 14 of the surface of the circuit board 12.

The probe assemblies 10 will be understood to be connected to some monitoring device or source (not shown), but that is not part of the present invention.

Figure 2:
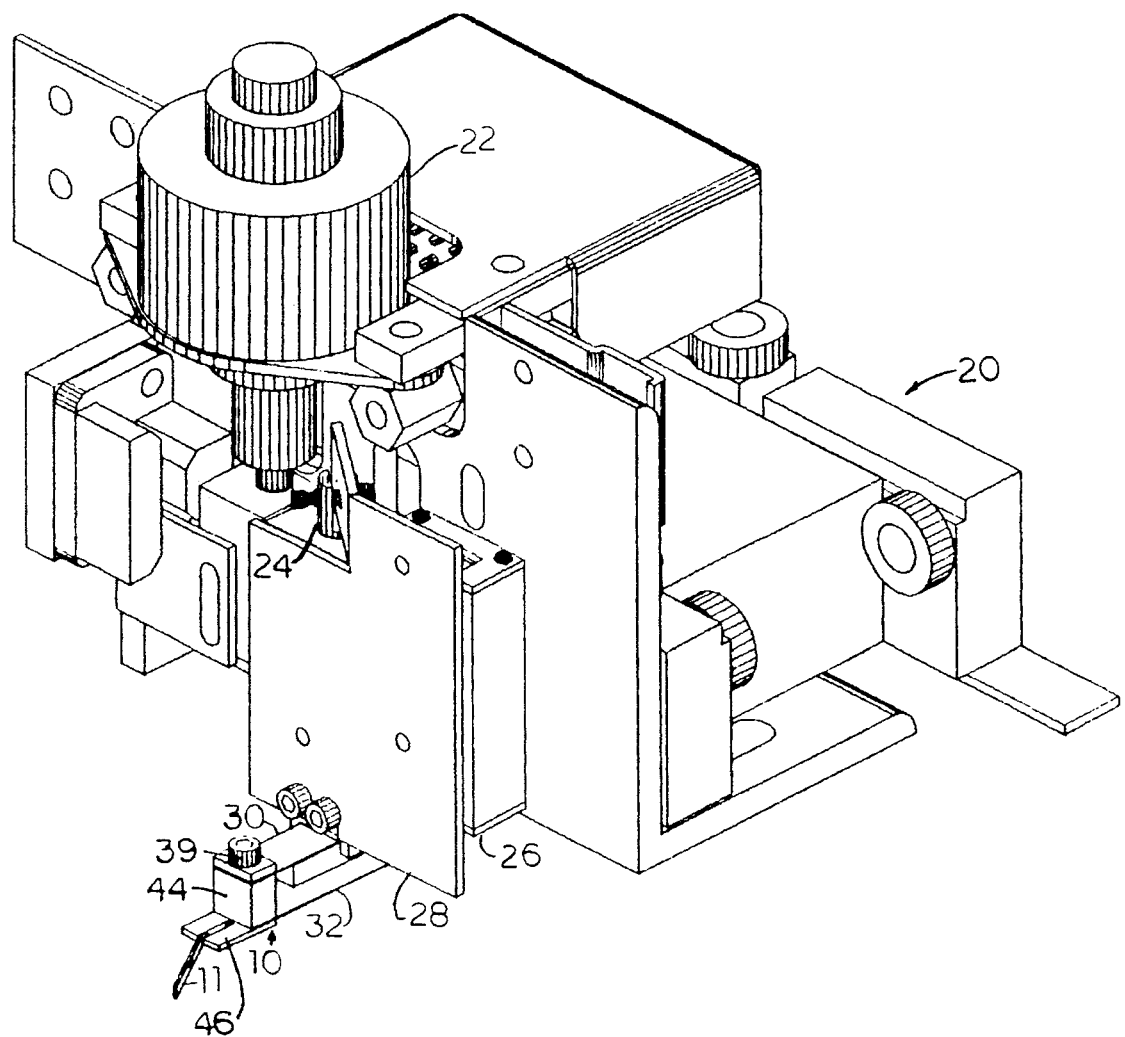
FIG. 2 is an isometric view of the z-axis subassembly of FIG. 1, shown in much larger scale, and removed from the overall view of FIG. 1 to better show the illustrative probing apparatus according to the invention, also showing some other details of the overall device which are not a part of this invention.
Figure 3:
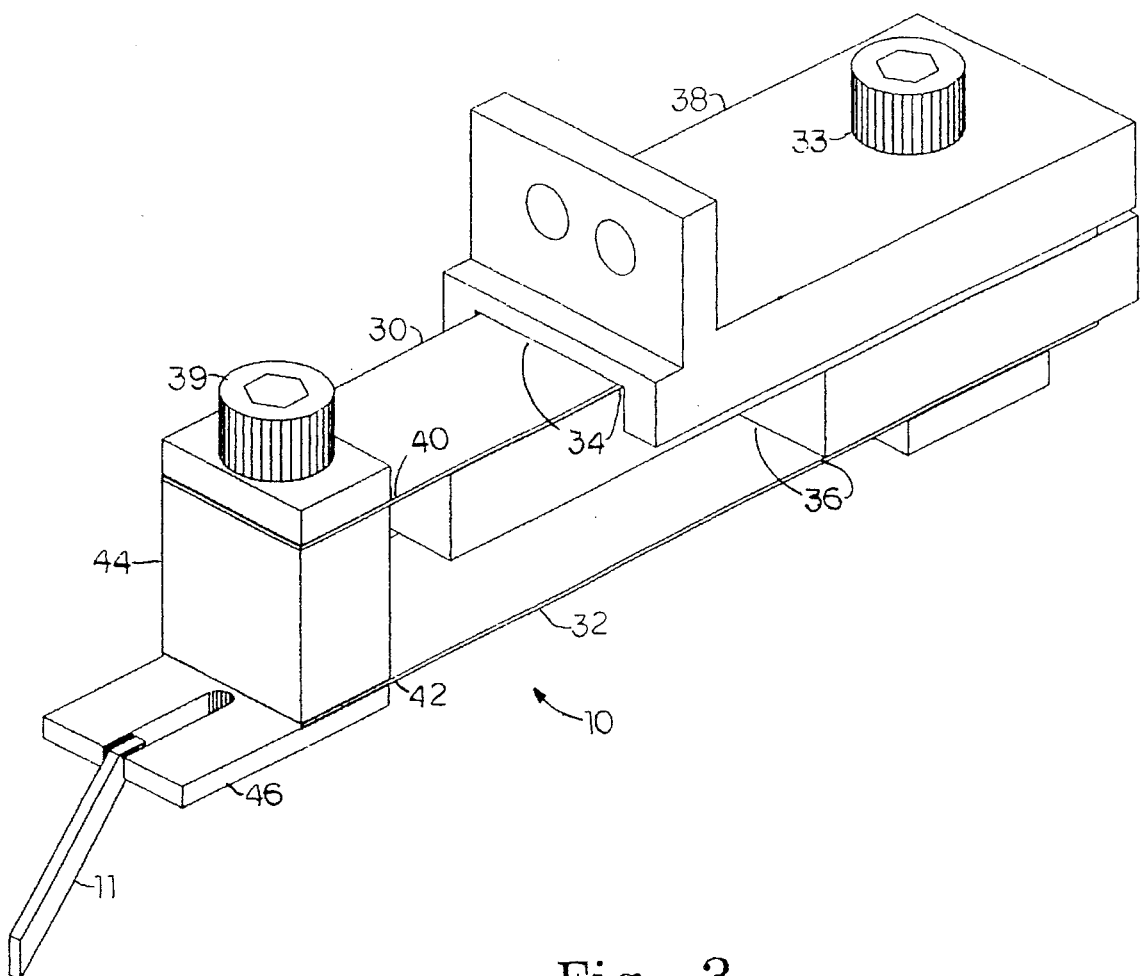
FIG. 3 is an isometric view of the dual beam probe assembly shown in FIG. 2.

Referring to FIGS. 1–3, the conventional structure of a probing apparatus is improved according to the invention by mounting one or more probe assemblies 10 to the mounting plate 28 using two cantilever flexible beams 30 and 32, and beam 30 spaced above the other 32, and by bolt 33 attaching both beams 30 and 32 at their inner ends 34 and 36, respectively, to a mounting bracket assembly 38, and attaching mounting bracket 38 to the z-axis mounting plate 28 of z-axis slide mechanism 26, and by bolt 39 attaching the other or outer end 40 and 42, respectively, of the beams 30 and 32 to the front spacer block 44 and a probe-carrying nose plate 46 that serve to secure the end of the flex beams 30 and 32 to the actual probe element 11.

By the combination of such additions to conventional prober apparatus, the invention provides gentle nondestructive probing with non-wiping probe contact.

The present invention provides the advantages of nearly eliminating the destructive wiping action caused by the flexing of the probe support beam, by using the interaction caused by the length and mounting positions of the two flex beams 30 and 32 to maintain the position of the probe tip 11. When the probe tip. 11 comes in contact with the circuit contact area 14, the resulting motion is a pivoting of the upper section of the probe carrying members (nose plate 46 and front spacer block 44) in the x-z plane, pivoting at the initial contact point 14 of the probe tip 11. Variation in the surface elevation of the work object board 12 being probed, such as with warped circuit boards 12, will cause the beams 30 and 32 to flex without significantly affecting probe tip 11's position.

To illustrate this effect, reference is made to the probe assembly 47 of FIG. 4. FIG. 4, although somewhat different from the embodiment shown in FIGS. 1–3, will serve as a good model to demonstrate the operation of this unique invention, and to show the method by which the relationship of its various components may be determined to provide the apparatus.

If desired, the rigid beams 48 and 50 as shown in FIG. 4 can be replaced with beams 30 and 32 of FIG. 3, to provide similar motion of the position of probe tip 11 of FIG. 3 to that of probe tip 52 of FIG. 4. The flexible beams 30 and 32 of FIG. 3 can provide the natural spring force required to dependably probe the contact area of the circuits under test and return the probe to original position when removed from the surface of the contact area. Various materials both insulating and conductive and of various stiffness and springiness can be used for the flexible beams 30 and 32 of FIG. 3 depending on the required probe force of the application.

In the schematic illustration (FIG. 4) of the probe assembly 10, the beams 48 and 50 are depicted as rigid beam members, connected at their ends remote from the probe tip 52, those ends shown (FIG. 4) as 54 and 56, respectively, to the mounting bracket 58, which is supportively connected to a support piece 59, and the other end, the end adjacent the probe tip 52, respectively 60 and 62, connected to the probe mounting nose piece 64, and a probe 66 attached to nose piece 64.

First, it is to be noted that the goal is to achieve a straight line motion in the z-axis of the probe tip 52 in line with the path of line 68, that line representing the z-axis. It should be noted that if support beam 48 is removed, then probe tip 52 can be manually moved along the line 68 until the combined length of beam 50 and probe body 66 is such that the probe tip 52 can no longer reach the line 68.

While the probe tip 52 is moved from the lowest point of contact 69a to the highest point of contact 69b on the line 68, the path of pivot joint 70 of nose piece 64 where beam 48 was connected can be traced. The resulting path is shown as a curved dashed line 72 in FIG. 4.

Now the probe tip 52 is moved to three points on the straight line 68, where the two extreme points are the maximum upward point 74a and lower point 74c of the required probe tip travel, and the third point 74b is the midpoint of the required travel for the particular application. The pivot joint 70 of nose piece 64 where beam 48 was connected has three positions corresponding to points 74a, 74b, and 74c. Those three positions of pivot joint 70 (70a, 70b, 70c) define a radius 77 and center point 80 of a circular arc 78; and the resulting center of the circular arc 78 is then used as the location for the pivot joint 80 for the fixed end of upper beam 48.

The upper beam 48, which is provided to be of a length equal to the radius 77 of the circular arc 78, is connected between pivot joint 70 of the nose piece 64 and fixed joint 80. The resulting probe assembly is such that when the probe tip 52 is moved, the pivot joint 70 will pass through the points used to define the circular arc 78, thereby causing the probe tip 52 to pass through the three corresponding point positions 74a, 74b and 74c that are on a straight line path 68, thus producing nearly linear motion between the points.

The resulting motion is a rotation of the probe tip body 66, in the x-z plane, pivoting at the initial contact point of the probe tip 52 to a work object (not shown in Fig.4), that is relatively movable to the support piece 59 thus avoiding an x-y plane "wiping" of the probe over the contact area which may damage the work object being probed.

Other combinations of beam lengths, positions of beam pivot joints, end spaced relationship on the probe nose extensions will provide near-linear travel of the probe tip. The means of determining these other combinations can be obtained as described above, by first selecting other lengths and positions for the beams and supports except for one missing beam, and then by following the above procedure to determine the length and position of the missing beam.

Still noting the embodiment of FIG. 4 as to reference numbers of components, Table 1 seems to be helpful to illustrate the range of the above method as to the concept of the displacement of the joints in carrying out this invention.

More particularly, Table 1 applies the method above to illustrate the range of lateral displacement of the position of the first joint 54 of the upper beam 48 from the position of the first joint 56 of the lower beam 50 as a function of the probe length in the downward direction 82, and the vertical separation 83 of the joints 54/56. This data is for the optimum conditions where the second joints of both beams are spaced one above the other, and the probe is pointing straight down (although in FIG. 4 the probe 66 is not being held in a straight downward manner), when the beams are parallel. However, other conditions will produce similar results, except the region of linear travel will be reduced.

(The values shown in the Table are shown in terms of ratios, for the specific, values are meaningful in terms of their relationships to other values.)

In the Table, the lateral displacement 84 of the beams' first joints 54/56, and their vertical separations 83, are shown as ratios to the lower beam 50's length. The probe's downward component lengths 82 are shown as ratios to the beams' first joints separation 83.

TABLE 1

LATERAL DISPLACEMENT 84 OF THE BEAMS' FIRST JOINT RATIO TO 50

| Downward Probe length 82 | Vertical Separation 83 Ratio of joints 54/56 to 50 | | | | | |
|---|---|---|---|---|---|---|
| Ratio to 83 | 0.1 | 0.2 | 0.4 | 0.8 | 1.6 | 3.2 |
| 32 | .027 | .027 | .027 | .026 | .026 | .026 |
| 16 | .054 | .053 | .052 | .051 | .051 | .051 |
| 8 | .103 | .101 | .099 | .098 | .097 | .096 |
| 4 | .190 | .196 | .181 | .177 | .174 | .172 |
| 2 | .322 | .315 | .307 | .298 | .291 | .285 |
| 1 | .488 | .479 | .468 | .453 | .437 | .424 |
| 0.5 | .654 | .645 | .630 | .609 | .583 | .555 |
| 0.25 | .788 | .778 | .761 | .734 | .697 | .649 |
| 0.125 | .877 | .867 | .848 | .817 | .762 | .698 |
| 0.0625 | .929 | .919 | .899 | .864 | .805 | .712 |
| 0.03125 | .958 | .947 | .926 | .888 | .820 | .705 |

The importance of Table 1, covering substantially the entire range of practical probe configurations, is that it shows that substantial lateral displacement of the first joint of the upper beam is required in order to approach a linear probe path. For example, referring to Table 1, even for an unlikely downward probe length 82 of eight times the vertical separation 83 between first joints 54/56, the lateral displacement 84 of the upper beam's first joint 54 to the lower beam's first joint 56, must be at least ten percent of the length of the lower beam 50, for the range of the Table's vertical separation 83 as shown in Table 1. (The actual Table values are 0.096 to 0.103.) For shorter probe lengths, the required displacement is shown as being even greater.

In accordance with the above illustration, it should be seen that for conditions in Table 1, for vertical separation 83 of the joints 54/56, and downward probe length 82, any value close to the corresponding displacement 84, shown in Table 1, will provide an improvement in a linear probe path over prior art.

VII. SUMMARY AS TO INVENTIVE NATURE OF THE CONCEPTS

In a hindsight consideration of the present invention's concepts to determine the inventive and novel nature of the invention as a whole, it is not only conceded but emphasized that the prior art had multiple details of support, probes, and probe-carrying arms etc., which would have been usable in this invention, but only if the prior art had had the guidance of the concepts of the present invention; and the prior art for several years has had much motivation as to probing apparatus of the nature of present invention.

That is, it is emphasized that the prior art had several particulars of prior art and motivation which individually and accumulatively show the non-obviousness of this combination invention as to its various features such particulars including supports for probes for various purposes even including those to test or monitor electronic circuitry.

Further, as is well known, the field of electric and electronic equipment is quite competitive commercially.

With the reality of these and other factors, and without the prior art having the creative insight to achieve this invention, the inventive non-obviousness of the present invention is quite manifest.

The existence of probe devices is not only conceded, it is emphasized; for as to the novelty here of the combination, of the invention as considered as a whole, a contrast to the prior art helps show both the great variety of the various prior art's failure to achieve an advantageous probing apparatus such as the present invention as an improvement, and the advantages and the inventive significance of the present concepts. Thus, as shown herein as a contrast to all the prior art, the inventive significance of the present concepts as a combination is emphasized, and the nature of the concepts and their results can perhaps be easier understood.

Although varieties of prior art are conceded, and ample motivation is shown; and full capability in the prior art is conceded, no prior art shows or suggests details of the overall combinations of the present invention, as is the proper and accepted way of considering the inventiveness nature of the concepts.

Accordingly, the various concepts useful as probe mechanisms and components useable in probe mechanisms are conceded and emphasized to have been widely known in the prior art as to various devices nevertheless, the prior art not having had the particular combination of concepts and details as here presented and shown in novel combination different from the prior art and its suggestions, even only a fair amount of realistic humility, to avoid consideration of this invention improperly by hindsight, requires the concepts and achievements here to be realistically viewed as novel combinations, inventive in nature. And especially is this a realistic consideration when viewed from the position of a person of ordinary skill in this art at the time of this invention, and without trying to reconstruct this invention from the prior art without use of hindsight toward particulars not suggested by the prior art of all relevant fields.

CONCLUSION

It is thus seen that probe apparatus, especially in the form as provided and used according to the inventive concepts herein set forth, provides novel concepts of a desirable and advantageous device, yielding the advantages of an overall probe assembly having advantageous details and features, which, in overall combination, is and are conceptually different from the prior art probe mechanisms even though various objects embodying certain of the mechanical details as a basic capability have of course been known for years; yet significantly this particular combination, even considered as including or building on prior art concepts, has not been suggested by the prior art, this achievement being a substantial and advantageous departure from prior art, all this even though the prior art shows attempts at improvement and variations as to probe devices and other surface testing and circuit testing devices for many years.

And particularly is the overall difference from the prior art significant when the non-obviousness is viewed by a consideration of the subject matter as a whole, as integrally incorporating a combination of features, some different and some similar to the prior art, in contrast to merely those details of novelty themselves, and further in view of the prior art teaching away from the particular and inter-related concepts and features of the present invention.

In summary as to the nature of these advantageous concepts, their inventiveness is shown by novel features of concept and construction shown here, in novel and advantageous combination, not only being different from all the prior art known, but because the achievement is not what is or has been suggested to those of ordinary skill in the art, especially realistically considering this as comprising components which individually are similar in nature to what is well known to competitive manufacturers of electronic circuit boards and other surface-sensing devices for many years. No prior art has suggested the modifications of any prior art to achieve the novel concepts here achieved, with the various features providing their own functions in the overall combination; and this is particularly significant since test-probe devices are probably in as competitive and commercial a field of art as any field in the present era.

Accordingly, it will thus be seen from the foregoing description of the invention according to these illustrative embodiments, considered with the accompanying drawings, that the present invention provides new and useful concepts of a novel and advantageous method and probe apparatus, having and yielding desired advantages and characteristics in formation and use, and accomplishing the intended objects, including those herein-before pointed out and others which are inherent in the invention, considered as an apparatus and the method or process of its making.

Modifications and variations may be effected without departing from the scope of the novel concepts of the invention; accordingly, the invention is not limited to the specific embodiments, or form or arrangement of parts herein described or shown for illustrating the concepts and their cooperation in the overall combination of novel apparatus and novel method of its production.

I claim:

1. A method for minimizing the wipe action on a contact surface by a beam supported probe tip of a probe body, comprising the steps of:

a. providing at least a first support beam and a second support beam, not necessarily parallel, each beam having first and second connection joints, said first connection joints being displaced, said support beams being in a spaced relationship to a work-object having the first support beam spaced between the second beam and the work-object, the support beams being connected to a first support means that is relatively movable to the work-object at first joints, and the second ends of the beams being connected at second joints to a movable second support means, the said second support means carrying the probe body, and supporting the probe body such that the motion, of the second joints of the beams connected to the second support means, closely matches whatever curvature of the paths is required to substantially maintain the probe tip on whatever is the required linear probe path, when a linear motion of the relatively movable first support means of the beam supported probe is provided relative to a contact area of whatever is the associated surface of the work-object being probed, in which the probe tip is the part of the probe body which contacts the contact area of the surface of the work-object being probed, thereby providing that the only resulting said relative motion of the probe body and the probe tip is a rotation of the probe body pivoting at an initial point of contact of the probe tip with the work-object, and thus providing that a line through the beams' second joints at the second support means need not be perpendicular to either beam to provide a substantially linear probe path, b. providing the first support means supportively connected to a first end of both beams at first connection joints, c. providing a position for the first support means that is spaced above and relatively movable to the work-object, and spaced from the required linear probe path, d. providing a second support means to be carried by the beams at their second ends and connected thereto at second connection joints, and such that the second support means carries the probe body with the tip extending in the direction of the probing surface of the associated work-object, e. providing a position for the first beam's first connection joint on the first support means, f. providing a position for the first beam's second connection joint on the second support means, g. said two positions of the first and second connecting joints being such as to provide the combined length of the first support beam and the probe body to be sufficient to enable the probe tip to reach all points along whatever is the required linear probe path, h. providing an associated carrying means which is movable relative to the work-object and carrying the first support means, i. providing a position for the second beam's second connection joint on the second support means that is spaced from the first beam's second connection joint on the second support means, j. the length of the second beam being such, and the position of the second beam's first connection joint being such, that if the tip of the probe body is moved with only the first beam connected to the first and second supports as specified above, to three positions substantially on and spaced throughout the entirety of whatever is the required linear probe path, the second beam's second connection joint on the second support means having three joint positions which, by corresponding to the positions of the probe tip as specified above, are used to define a circle that passes through the three joint positions, the radius of the said circle being substantially the length of the second beam, and the center of the said circle being substantially the location of the first support position of the second beam's first joint, k. the length and joint positions of the second beam as specified above thereby causing the tip of the probe body, when moved relative to the first supporting means such that it passes through the said three positions, thus producing a substantially linear motion throughout the entirety of the range of said three points, the shape as specified above which is formed by the connection of the beams and their supporting means providing that the beams and their support means are operative as specified above, regardless of whether they have any sides parallel or any joints perpendicular, and even if the second connection joint of the first beam to a support means is directly above or directly below the second connection joint of the second beam to the second support means, the beams being supported in a relatively adjacent spaced relationship such that the perpendicular distances of the beams' first connection joints to the required linear probe path are different.

2. The method of claim 1 including the step of supporting the beams in a relatively adjacent spaced relationship such that the perpendicular distances of the beams' first connection joints to the required linear probe path are significantly different.

3. The method of claim 1 including the step of supporting the beams in a relatively adjacent spaced relationship such that a line passing through the first connection joints of the first and second beams will be significantly non-parallel to the required linear probe when the second beam is connected to the first connection joint.

4. The method of claim 1 including the step of supporting the beams in a relatively adjacent spaced relationship such that the perpendicular distances of the beams' first connection joints to the required linear probe path are significantly different, and the supporting of the beams is also such that a line passing through the first connection joints of the first and second beams will be significantly non-parallel to the required linear probe path when the second beam is connected to the first connection joint.

5. The method of claim 1 in which the location of the first support position of the second beam's first joint is spaced above and laterally displaced at least half way between two lines that are parallel to the linear probe path such that one line passes through the first joint of the first beam and the second line passes through the center of said circle, the joint positions of the second beam thereby improving the probe path straightness of movement of the probe tip.

6. The method of claim 1 in which the lateral displacement of the first joint of the second beam from a line that is parallel to the linear probe path, and passes through the first joint of the first beam, is greater than two hundredths of the length of the first beam, the joint positions of the second beam thereby improving the probe path straightness of movement of the probe tip.

7. The method of claim 1 in which the lateral displacement of the first joint of the second beam from a line that is parallel to the linear probe path, and passes through the first joint of the first beam, is greater than one tenth of the length of the first beam, the joint positions of the second beam thereby improving the probe path straightness of movement of the probe tip.

8. The method of claim 1 in which the support beams are provided to be of unequal length.

9. An apparatus for minimizing the wipe action on a contact surface by a beam supported probe tip of a probe body, the apparatus comprising, in combination:

a. at least a first support beam and a second support beam, not necessarily parallel, each beam having first and second connection joints being displaced, said support beams being in a spaced relationship to a work-object having the first support beam spaced between the second beam and the work-object, a first support means and a second support means, the support beams being connected to the first support means that is relatively movable to the work-object, at first joints, and the second ends of the beams being connected at second joints to a movable second support means, the said second support means carrying the probe body, and supporting the probe body such that the motion, of the second joints of the beams connected to the second support means, closely matches whatever curvature of the paths is required to substantially maintain the probe tip on whatever is the required linear probe path, when a linear motion of the relatively movable first support means of the beam supported probe is provided relative to a contact area of whatever is the associated surface of the work-object being probed, the probe tip being the part of the probe body which is to operatively contact the contact area of the surface of the work-object being probed, thereby providing that the only resulting relative motion of the probe body and probe tip is a rotation of the probe body pivoting at an initial point of contact of the probe tip with the work-object, and thus providing that a line through the beams' second joints at the second support means need not be perpendicular to either beam to provide a substantially linear probe path, b. the first support means being supportively connected to a first end of both beams at first connection joints, c. the first support means provided with a position that is spaced above the work-object, and spaced from the required linear probe path, d. a second support means carried by the beams at their second ends and connected thereto at second connection joints, and such that the second support means carries the probe body with the tip extending in the direction of the probing surface of the associated work-object, e. the first beam's first connection joint on the first support means having a position as, f. the first beam's second connection joint on the second support means having a position, g. said two positions of the first and second connection joints being such as to provide that the combined length of the first support beam and the probe body are sufficient to enable the probe tip to reach all points along whatever is the required linear probe path, h. an associated carrying means which is movable relative to the work-object and carrying the support means, i. the second beam's second connection joint on the second support means being spaced from the first beam's second connection joint on the second support means, j. the length of the second beam being such, and the position of the second beam's first connection joint being such, that if the tip of the probe body is moved with only the first beam connected to the first and second supports as specified above, to three positions substantially on and spaced throughout the entirety of whatever is the required linear probe path, the second beam's second connection joint on the second support means having three joint positions which, by corresponding to the positions of the probe tip as specified above, are used to define a circle that passes through the three joint positions, the radius of the said circle being substantially the length of the second beam, and the center of the said circle being substantially the location of the first support position of the second beam's first joint, k. the length and joint positions of the second beam as specified above thereby causing the tip of the probe body, when moved relative to the first supporting means such that it passes through the said three positions, thus producing a substantially linear motion throughout the entirety of the range of said three points, the shape as specified above which is formed by the connection of the beams and their supporting means providing that the beams and their support means are operative as specified above, regardless of whether they have any sides parallel or any joints perpendicular, and even if the second connection joint of the first beam to a support means is directly above or directly below the second connection joint of the second beam to the second support means, the beams being supported in a relatively adjacent spaced relationship such that the perpendicular distances of the beams' first connection joints to the required linear probe path are different.

10. The apparatus of claim 9 in a combination in which the support of the beams is such that they are in a relatively adjacent spaced relationship such that the perpendicular distances of the beams' first connection joints to the required linear probe path are significantly different, 11. The apparatus of claim 9 in a combination in which the support of the beams is such that they are in a relatively adjacent spaced relationship such that a line passing through the first connection joints of the first and second beams will be significantly non-parallel to the required linear probe path when the second beam is connected to the first connection joint.

12. The apparatus of claim 9 in a combination in which the support of the beams is such that they are in a relatively adjacent spaced relationship such that the perpendicular distances of the beams' first connection joints to the required linear probe path are significantly different, and the supporting of the beams is such that a line passing through the first connection joints of the first and second beams will be significantly non-parallel to the required linear probe path when the second beam is connected to the first connection joint.

13. The apparatus of claim 9, in which the location of the first support position of the second beam's first joint is spaced above and laterally displaced at least half way between two lines that are parallel to the linear probe path such that one line passes through the first joint of the first beam and the second line passes through the center of said circle, the joint positions of the second beam as specified above thereby improving the probe path straightness of movement of the probe tip.

14. The apparatus of claims 9 in which the lateral displacement of the first joint of the second beam from a line that is parallel to the linear probe path, and passes through the first joint of the first beam, is greater than two hundredths of the length of the first beam, the joint positions of the second beam as specified above thereby improving the probe path straightness of movement of the probe tip.

15. The apparatus of claim 9 in which the lateral displacement of the first joint of the second beam from a line that is parallel to the linear probe path, and passes through the first joint of the first beam, is greater than one tenth of the length of the first beam, the joint positions of the second beam as specified above thereby improving the probe path straightness of movement of the probe tip.

16. The apparatus of claim 9 in which the support beams are provided to be of unequal length.

* * * * *

UNITED STATES PATENT AND TRADEMARK OFFICE
CERTIFICATE OF CORRECTION

PATENT NO. : 5,489,855
DATED : February 6, 1996
INVENTOR(S) : C. Edward Poisel

It is certified that error appears in the above-identified patent and that said Letters Patent is hereby corrected as shown below:

Col. 2, line 17:  "tips" should be:  -- tip --.
Col. 4, line 8:   "42" should be:  -- 48 --.
Col. 4, line 14,  "68e"      should be:  -- 68 --.
    Col. 4, line 23, "an" should be:  -- on --.
Col. 5, line 17:  There should be no period before "11".

Col. 6, line 60:  after "specific" there should be no comma.
Col. 7, line 12:  ".196" should be:  -- .186 --.
Col. 7, line 16:  ".762" should be:  -- .768 --.
Col. 7, line 55:  after "features" there should be a comma.
Col. 8, line 18:  after "devices" there should be a semi colon.

Col. 9, line 25:  "I Claim:" should be:  -- CLAIMS --.

Signed and Sealed this

Thirteenth Day of August, 1996

Attest:

BRUCE LEHMAN

*Attesting Officer*        *Commissioner of Patents and Trademarks*